(12) United States Patent
Chae

(10) Patent No.: US 11,897,981 B2
(45) Date of Patent: Feb. 13, 2024

(54) OPTICAL RESIN AND LIGHTING DEVICE HAVING SAME

(71) Applicant: LG INNOTEK CO., LTD., Seoul (KR)

(72) Inventor: Hyun Hee Chae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 68 days.

(21) Appl. No.: 17/626,243

(22) PCT Filed: Jul. 22, 2020

(86) PCT No.: PCT/KR2020/009644
§ 371 (c)(1),
(2) Date: Jan. 11, 2022

(87) PCT Pub. No.: WO2021/015548
PCT Pub. Date: Jan. 28, 2021

(65) Prior Publication Data
US 2022/0259349 A1    Aug. 18, 2022

(30) Foreign Application Priority Data

Jul. 25, 2019   (KR) .................. 10-2019-0090370

(51) Int. Cl.
*C08F 220/18*    (2006.01)
*F21K 9/68*    (2016.01)
(Continued)

(52) U.S. Cl.
CPC .......... *C08F 220/1811* (2020.02); *C08F 2/44* (2013.01); *C08F 2/50* (2013.01);
(Continued)

(58) Field of Classification Search
CPC ........ C08F 220/1811; C08F 2/44; C08F 2/50; C08F 220/325; C08F 220/18;
(Continued)

(56) References Cited

U.S. PATENT DOCUMENTS 9,086,209 B2    7/2015    Park et al.
9,664,844 B2    5/2017    Park et al.
(Continued)

FOREIGN PATENT DOCUMENTS

CN    101370836    2/2009
CN    103511884    1/2014
(Continued)

OTHER PUBLICATIONS

International Search Report dated Nov. 23, 2020 issued in Application No. PCT/KR2020/009644.
Chinese Office Action dated Dec. 2, 2022 issued in Application No. 202080053859.2.

*Primary Examiner* — Elmito Breval
(74) *Attorney, Agent, or Firm* — KED & Associates LLP

(57) ABSTRACT

A lighting device disclosed in an embodiment of the invention includes a substrate; a light emitting device disposed on the substrate; a resin layer sealing the light emitting device on the substrate; and a diffusion layer or a reflective substrate disposed on the resin layer, wherein the resin layer includes an oligomer, a monomer, and an additive, wherein the monomer includes IBOA (Iso-bornyl Acrylate), two or more dilution monomers and glycidyl methacrylate (GMA), the additive includes a photoinitiator and an amine-based light stabilizer, and in the oligomer and the monomer, the content of glycidyl methacrylate is 10 to 15%, and the resin layer may be a curable transparent resin cured by ultraviolet light.

15 Claims, 8 Drawing Sheets

(51) Int. Cl.
*C08F 220/32* (2006.01)
*C08F 2/44* (2006.01)
*C08F 2/50* (2006.01)
*C08K 5/00* (2006.01)
*C08K 5/17* (2006.01)
*G02B 1/04* (2006.01)
*G02B 5/02* (2006.01)
*F21Y 115/10* (2016.01)
*F21S 43/33* (2018.01)

(52) U.S. Cl.
CPC .......... *C08F 220/325* (2020.02); *C08K 5/005* (2013.01); *C08K 5/17* (2013.01); *F21K 9/68* (2016.08); *G02B 1/04* (2013.01); *G02B 5/0268* (2013.01); *F21S 43/33* (2018.01); *F21Y 2115/10* (2016.08)

(58) Field of Classification Search
CPC .......... C08F 220/32; C08K 5/005; C08K 5/17; C08K 5/07; C08K 5/3435; F21K 9/68; F21K 9/20; G02B 1/04; G02B 5/0268; F21S 43/33; F21Y 2115/10; B60Q 1/0041; C09J 133/068; H01L 33/56; F21V 2200/20

See application file for complete search history.

(56) References Cited

U.S. PATENT DOCUMENTS

| | | | |
|---|---|---|---|
| 9,933,126 | B2 | 4/2018 | Park et al. |
| 10,627,064 | B2 | 4/2020 | Park et al. |
| 11,248,764 | B2 | 2/2022 | Park et al. |
| 2010/0227993 | A1 | 9/2010 | Kobayashi et al. |
| 2012/0288718 | A1 | 11/2012 | Takano et al. |
| 2013/0335975 | A1 | 12/2013 | Park et al. |
| 2014/0029263 | A1 | 1/2014 | Park et al. |
| 2014/0320770 | A1 | 10/2014 | Motohashi et al. |
| 2015/0197689 | A1* | 7/2015 | Tani ................ C09K 11/77342 252/301.36 |
| 2015/0285990 | A1 | 10/2015 | Park et al. |
| 2016/0047948 | A1 | 2/2016 | Kim et al. |
| 2017/0227181 | A1 | 8/2017 | Park et al. |
| 2018/0172230 | A1 | 6/2018 | Park et al. |
| 2020/0217470 | A1 | 7/2020 | Park et al. |
| 2022/0128207 | A1 | 4/2022 | Park et al. |

FOREIGN PATENT DOCUMENTS

| | | | |
|---|---|---|---|
| CN | 103732640 | | 4/2014 |
| JP | 2016-053174 | | 4/2016 |
| KR | 10-2012-0009507 | | 1/2012 |
| KR | 20120051946 A | * | 5/2012 |
| KR | 10-2013-0142030 | | 12/2013 |
| KR | 10-2014-0051958 | | 5/2014 |
| KR | 10-2014-0143740 | | 12/2014 |

* cited by examiner

OPTICAL RESIN AND LIGHTING DEVICE HAVING SAME

CROSS-REFERENCE TO RELATED PATENT APPLICATIONS

This application is a U.S. National Stage Application under 35 U.S.C. § 371 of PCT Application No. PCT/KR2020/009644, filed Jul. 22, 2020, which claims priority to Korean Patent Application No. 10-2019-0090370, filed Jul. 25, 2019, whose entire disclosures are hereby incorporated by reference.

TECHNICAL FIELD

An embodiment of the invention relates to an optical resin used for lighting and a lighting device having the same.

BACKGROUND ART

Lighting applications include vehicle lights as well as backlights for displays and signage. Light emitting diodes (LEDs) have advantages such as low power consumption, semi-permanent lifespan, fast response speed, safety, and environmental friendliness compared to conventional light sources such as fluorescent lamps and incandescent lamps. Such a light emitting device is applied to various lighting devices such as various display devices, indoor lights or outdoor lights. Recently, as a light source for a vehicle, a lamp employing an LED has been proposed. Compared with incandescent lamps, LEDs are advantageous in that their power consumption is small. However, since an emission angle of the light emitted from the LED is small, when the LED is used as a vehicle lamp, there is a demand for increasing the light emitting area of the lamp using the LED. Because LED is small in size, it can increase the design freedom of the lamp, and it is also economical due to its semi-permanent lifespan.

DISCLOSURE

Technical Problem

An embodiment of the invention may provide an optical resin for guiding light of a light emitting device. The optical resin may include an acrylate having an epoxy group. An embodiment of the invention may provide an optical resin including an additive such as a light stabilizer and a monomer such as glycidyl methacrylate (GMA). An embodiment of the invention may provide a lighting device including an additive such as a light stabilizer and a monomer such as GMA in a resin layer surrounding a light emitting device. An embodiment of the invention may provide a lighting device including an additive such as a HALS (Hindered-Amine Light Stabilizers)-based stabilizer and a monomer such as GMA in a resin layer in contact with the molding portion of the light emitting device.

Technical Solution

An optical resin according to an embodiment of the invention comprises: in an optical resin disposed on a surface of a molding member sealing a light emitting chip or a surface of a light emitting device having the light emitting chip, an oligomer, a monomer, and an additive, wherein the monomer is IBOA (Iso-bornyl Acrylate), containing two or more diluting monomers and glycidyl methacrylate (GMA), and the additive includes a photoinitiator of ultraviolet wavelength and an amine-based light stabilizer, in the oligomer and the monomer, a content of the glycidyl methacrylate may be 10 to 15%.

According to an embodiment of the invention, the dilution monomers include caprolactone acrylate and lactone methacrylate, and the light stabilizer may include a Hindered-Amine Light Stabilizers (HALS)-based UV Stabilizer. The photoinitiator has a higher content than the light stabilizer, and may include 0.5 to 3 wt % based on the weight of the oligomer and the monomer. The monomer may not include an acrylate having a hydroxy group. A lighting device according to an embodiment of the invention includes: a substrate; a light emitting device disposed on the substrate; a resin layer sealing the light emitting device on the substrate; and a diffusion layer or a reflective substrate disposed on the resin layer, wherein the resin layer includes an oligomer, a monomer, and an additive, wherein the monomer is IBOA (Iso-bornyl Acrylate), two or more dilution monomers and glycidyl methacrylate (GMA), the additive includes a photoinitiator and an amine-based light stabilizer, and in the oligomer and the monomer, the content of glycidyl methacrylate is in a range of 10 to 15%, and the resin layer may be a curable transparent resin cured by ultraviolet light.

According to an embodiment of the invention, the light emitting device includes a light emitting chip therein, and a molding member sealing the light emitting chip, and emits light in a lateral direction of the resin layer through an emission surface of the molding member, The emission surface of the molding member may be in contact with the resin layer. In the resin layer, the content of the oligomer may be 20-25%, the content of the IBOA may be 40-50%, and the content of the dilution monomer may be 10-20%. The photoinitiator is an initiator of ultraviolet wavelength, and the content of the photoinitiator in the resin layer may be higher than the content of the light stabilizer. Based on the sum of the masses of the oligomer and the monomer in the resin layer, the content of the photoinitiator may be 0.5 to 3 wt %, and the content of the light stabilizer may be 0.5-2 wt %. The dilution monomers may include caprolactone acrylate and lactone methacrylate, and the light stabilizer may include a Hindered-Amine Light Stabilizers (HALS)-based UV stabilizer. The oligomer may include at least two or more of polyester acrylate, epoxy acrylate, polyether acrylate, and silicone acrylate, and the monomer may be a material that does not include an acrylate having a hydroxyl group.

Advantageous Effects

According to an embodiment of the invention, by including a monomer such as GMA in the resin layer surrounding the light emitting device, adhesion and oxidation prevention may be improved.

According to an embodiment of the invention, by including a HALS (Hindered-Amine Light Stabilizers)-based stabilizer in the resin layer surrounding the light emitting device, decomposition and discoloration of the resin may be suppressed.

According to an embodiment of the invention, it is possible to improve the reliability of a module or device using a light emitting device having the resin layer and a colored light emitting chip.

According to the embodiment of the invention, oxidation by the metal surface in the circuit board on which the light emitting element and the resin layer are disposed may be suppressed. In addition, the reflective member between the circuit board and the resin layer may be removed.

According to an embodiment of the invention, it is possible to improve the reliability of a light emitting chip or an optical resin covering a light emitting device in which the light emitting chip is molded, and a module or device having the same.

BEST MODE

Hereinafter, preferred embodiments of the invention will be described in detail with reference to the accompanying drawings.

A technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

Example

Figure 1:
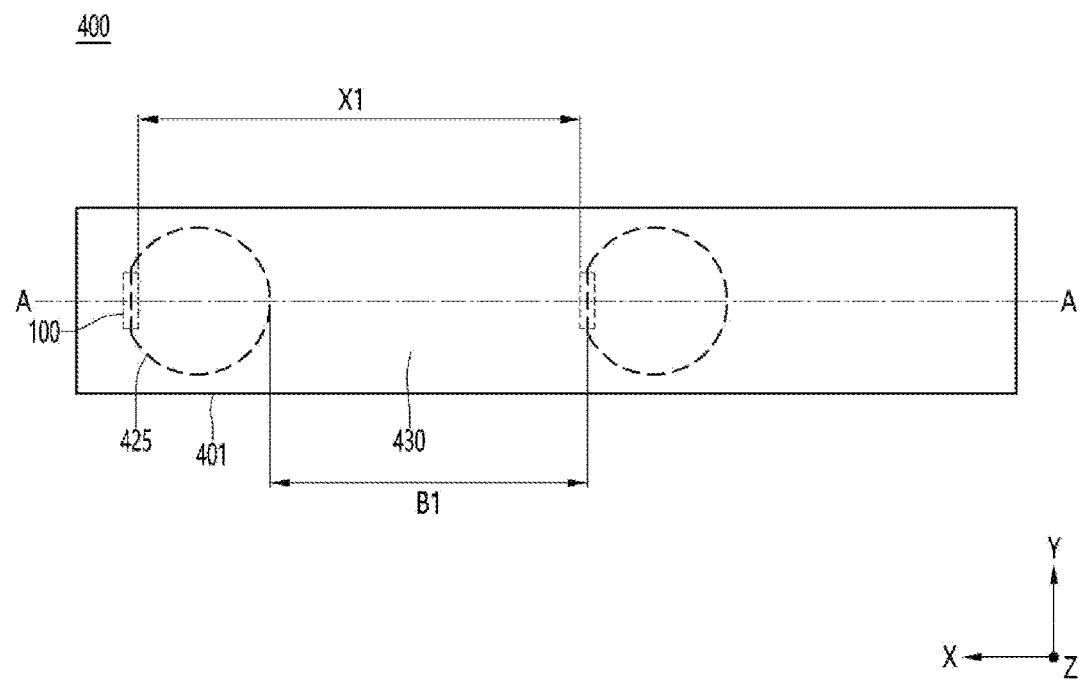
FIG. 1 is an example of a plan view of a lighting device according to an embodiment of the invention.
Figure 2:
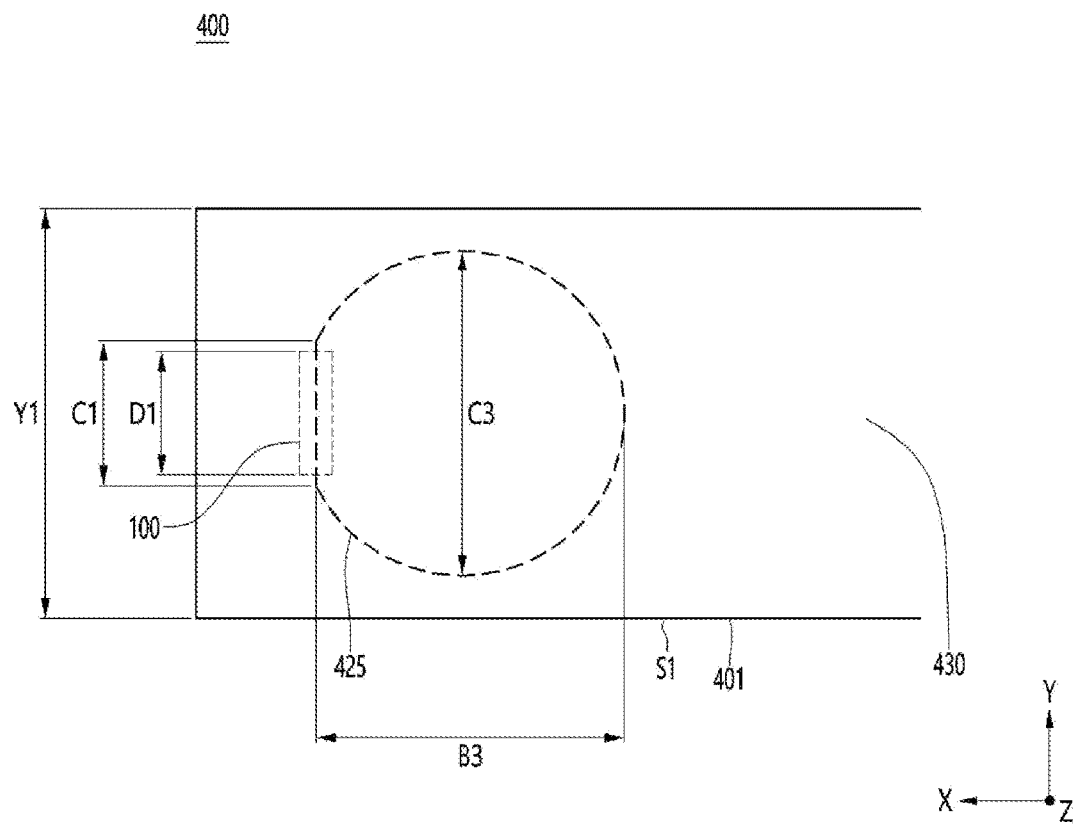
FIG. 2 is a partially enlarged view of FIG. 1.
Figure 3:
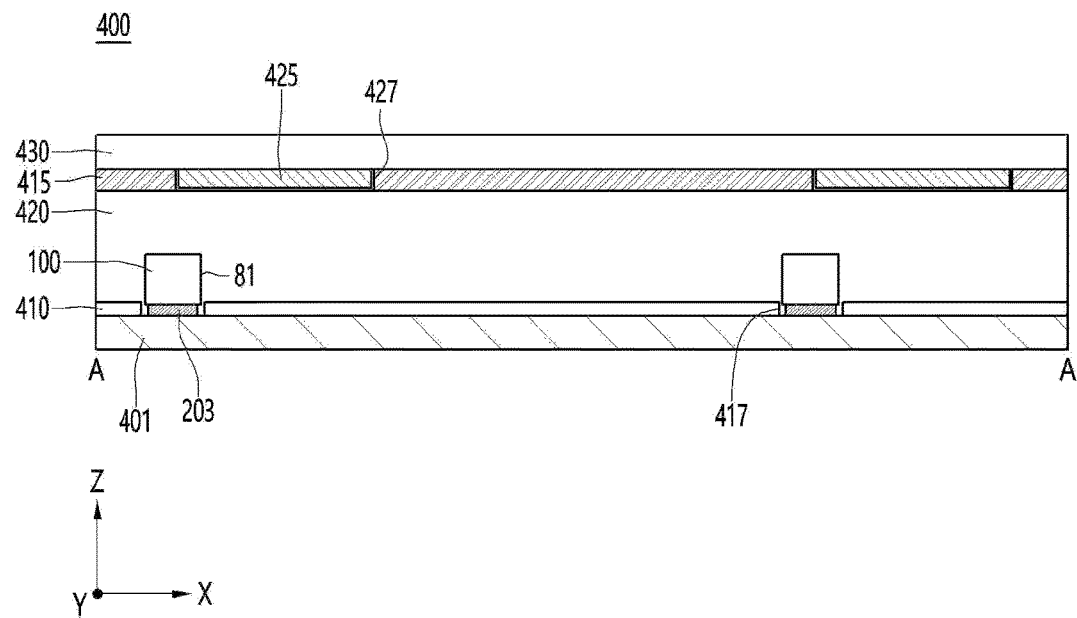
FIG. 3 is an example of a cross-sectional view taken along A-A side of the lighting device of FIG. 1.
Figure 4:
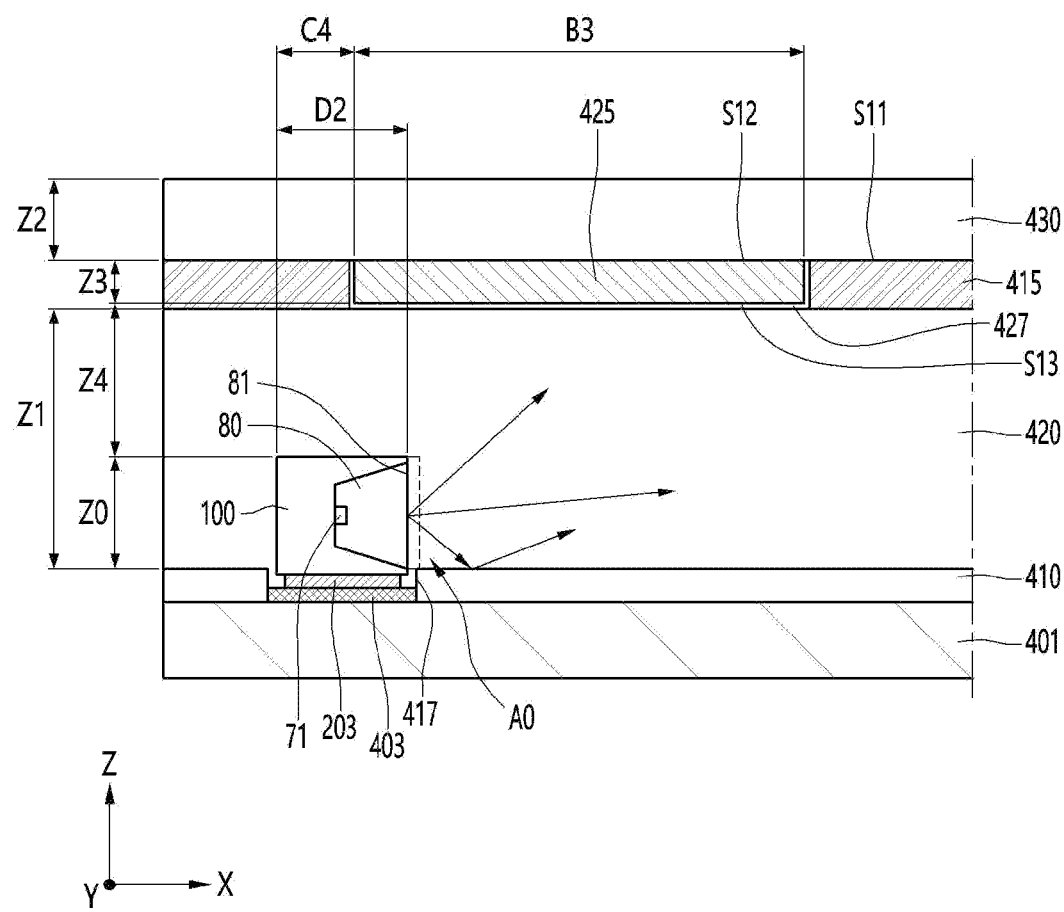
FIG. 4 is a partially enlarged view of the lighting device of FIG. 3 and is a view illustrating an optical path.
Figure 5:
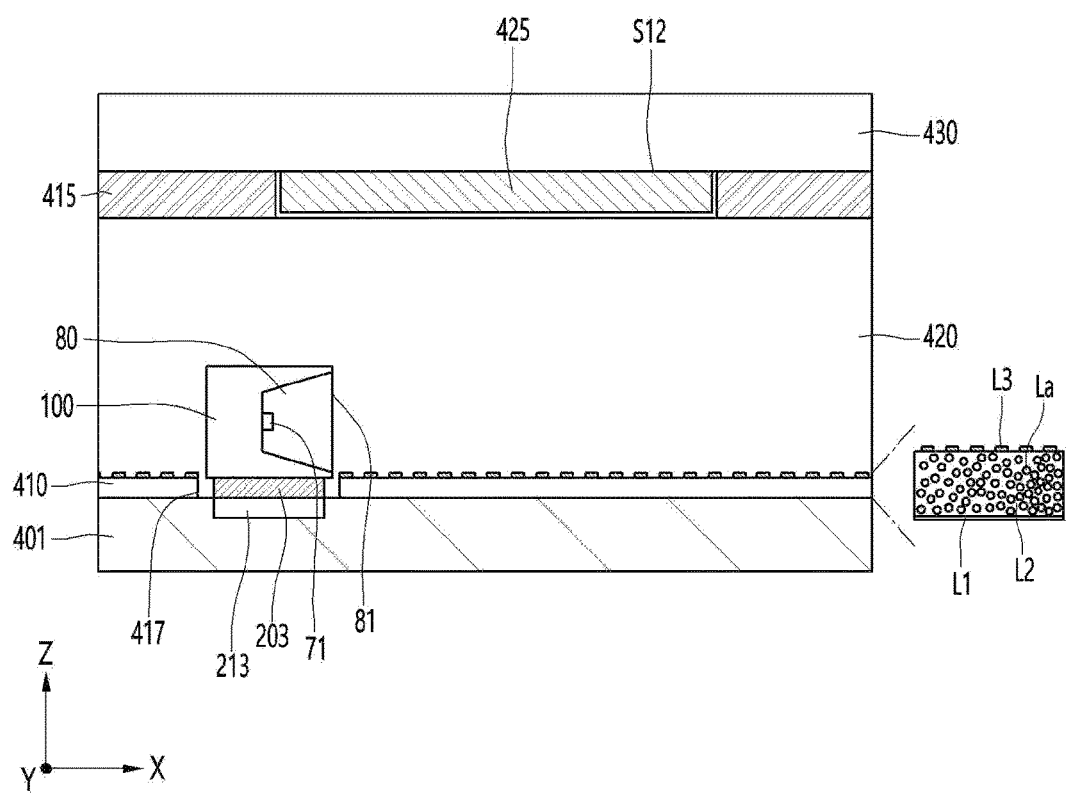
FIG. 5 is an example of a detailed configuration of a reflective member in the lighting device of FIG. 3.
Figure 6:
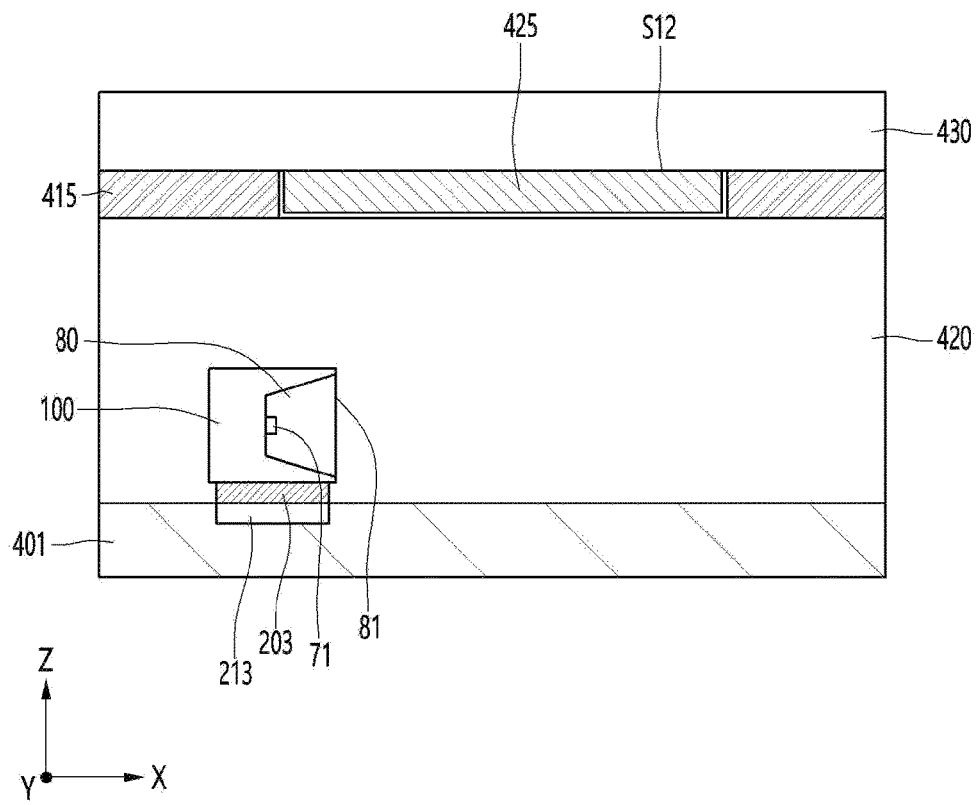
FIG. 6 is an example in which the reflective member is removed from the lighting device of FIG. 5.

FIG. 1 is an example of a plan view of a lighting device according to an embodiment of the invention, FIG. 2 is a partially enlarged view of FIG. 1, FIG. 3 is an example of a cross-sectional view on the A-A side of the lighting device of FIG. 1, and FIG. 4 is a partially enlarged view of the lighting device of FIG. 3 and a view explaining the light path, FIG. 5 is an example of a detailed configuration of the reflective member in the lighting device of FIG. 3, and FIG. 6 is an example in which the reflective member is removed from the lighting device of FIG. 5.

Referring to FIGS. 1 to 6, a lighting device 400 according to an embodiment of the invention may include a light emitting device 100 or a light emitting chip and a resin layer 420 formed of a resin material covering the light emitting device 100. The lighting device 400 may include a substrate 420 disposed under the light emitting device 100 or the light emitting chip, and the resin layer 420. The lighting device 400 may include at least one of a diffusion layer 430, a light blocking portion 425 and/or a light transmitting layer on the resin layer 420. The lighting device 400 may include a reflective member 410 disposed between the substrate 401 and the resin layer 420. The lighting device 400 according to an embodiment of the invention may emit the light emitted from the light emitting device 100 as a surface light source. The lighting device 400 may be defined as a light emitting cell or a light source module. The lighting device 400 may include one light emitting cell or a plurality of light emitting cells on the substrate 401.

The resin layer 420 according to an embodiment of the invention may include an optical resin disposed around the light emitting device 100 or the light emitting chip. The optical resin may guide the light emitted from the light emitting device 100 or the light emitting chip, and may emit the guided light in the form of a surface light source through an emission surface. The optical resin may include an acrylate having an epoxy group. The optical resin may include an additive such as a light stabilizer and a monomer such as glycidyl methacrylate (GMA). The optical resin may include a HALS (Hindered-Amine Light Stabilizers)-based stabilizer and a monomer such as GMA. The optical resin uses an acrylate having an epoxy group and removes the acrylate having a hydroxy group to suppress oxidation of metals caused by moisture. Such an optical resin may include materials capable of improving adhesion with other components (e.g., a substrate, a light emitting device), suppressing oxidation induction, and preventing discoloration. The optical resin may be a curable transparent resin that is cured by at least one of ultraviolet light or infrared light. The optical resin may include an oligomer, a monomer, a photoinitiator, and a light stabilizer. In such an optical resin, for example, strong energy of ultraviolet light gives energy to initiate a chemical reaction to a photoinitiator, so that monomers and oligomers, which are the main components of ultraviolet curing paints, are instantaneously made into polymers. The monomers and oligomers are liquids in a steady state, but when the liquid turns into a polymer, it turns into a solid. The oligomer is a component that determines the physical properties of the resin, and may include at least two or more of polyester acrylate, epoxy acrylate, polyether acrylate, and silicone acrylate. The monomer is a reactive diluent, and may include Iso-bornyl Acrylate (IBOA), two or more diluting monomers, and Glycidyl methacrylate (GMA). These oligomers may be provided with a refractive index similar to that of a light guide plate such as PMMA, which is flexible and has excellent adhesion by adjusting the curing balance. The IBOA is a reactive diluent, and hardness, heat resistance, and transmittance may be adjusted according to its content. The dilution monomers include two to three kinds, and the physical properties of the resin may be adjusted according to the content thereof. The dilution monomers may include caprolactone acrylate and lactone methacrylate. The Glycidyl methacrylate (GMA) has an epoxy group in its molecule, so it may improve bonding or adhesion to various materials and prevent oxidation of metal materials. That is, the optical resin uses GMA having an acrylate having an epoxy group instead of using an acrylate having a hydroxyl group (e.g., 2-EHA) as a monomer, so that a metal material that is a material for a pad of a circuit board or an electrode of a light emitting device may prevent oxidation.

The content of the monomer in the optical resin may be three or more times higher than the content of the oligomer. The content of the oligomer in the optical resin is 25% or less of the total content, for example, in the range of 20 to 25%, and the content of the monomer is 75% or more, for example, it may be in the range of 80% to 85%. When the content of the oligomer is out of the above range, mechanical properties may vary, and when the content of the monomer is out of the range, properties such as transmittance, physical properties, adhesion, and oxidation prevention may vary. The contents of the materials in the optical resin are shown in Table 1.

TABLE 1

| Category | type | Content (%) |
| --- | --- | --- |
| Oligomer | Oligomer 2 types | 20-25% |
| Monomer | IBOA | 40-50% |
|  | Monomer for dilution | 10-20% |
|  | GMA | 10-15% |

The optical resin may include a first additive. The first additive may include a photoinitiator. The photoinitiator may be a mixture of at least one or more of TPO and DETX, for example, and may be mixture of at least one or two or more of 2,4,6-trimethylbenzoyl diphenyl phosphine oxide (TPO), 2,4-Diethylthioxanthone (DETX) or antioxidants. The photoinitiator may have a radical reaction to a long wavelength among ultraviolet wavelengths, and the long wavelength may be a wavelength of 300 nm or more, for example, in a range of 300 to 400 nm. The photoinitiator may include TPO. The optical resin may include a second additive, and the second additive may include a light stabilizer. The light stabilizer is an amine light stabilizer, and may protect the polymer from being decomposed when exposed to ultraviolet light, and may suppress discoloration. The light stabilizer is a HALS stabilizer, for example, and may include at least one or two or more of Bis (2,2,6,6-tetramethyl-4-piperidyl) sebacate (corresponding to Tinuvin-292), Bis (2,2,6,6-pentamethyl-5-piperidinyl) sebacate (corresponding to Tinuvin-770, Tinuvin 770DF), Tinuvin 384-2, Tinuvin 477, Blends (944+622) (corresponding to Tinuvin-783), Blends (944+770) (corresponding to Tinuvin-791), Tinuvin 292+477+384-2. Here, since the monomer and the photoinitiator in the optical resin are heat-resistant materials, they may withstand heat conducted through the substrate 401 and the light emitting device 100. The HALS-based stabilizer may be, for example, Bis (2,2,6,6-tetramethyl-4-piperidyl) sebacate. The content of the first additive in the optical resin may be higher than the content of the second additive. In the optical resin, the first additive (i.e., photoinitiator) may be 3 wt % or less, for example, in the range of 0.5 to 3 wt %, based on the sum of the masses of the oligomer and the monomer, and the second additive (i.e., light stabilizer) may be in the range of 2 wt % or less, for example, 0.5 to 2 wt %, based on the sum of the masses of the oligomer and the monomer. When the first additive is out of the above range, it may be difficult to control curing. When the second additive is out of the above range, it may be difficult to control the discoloration or decomposition of the resin. When the second additive exceeds the above range, curing of the resin may be slow. The weight % of the first additive and the second additive in the optical resin is as follows.

TABLE 2

| Category | type | Content (wt %) |
| --- | --- | --- |
| Photo-initiator | TPO | 0.5-3 |
| light stabilizer | HALS-based | 0.5-2 |

For the optical resin, a light guide plate such as transparent acrylic (e.g., PMMA) may be removed and a thin resin layer may be used as a light guide member. In addition, the composition of the optical resin may be formed using a mixed composition of oligomer type and monomer type, and reliability may be improved by increasing the productivity and reliability of the oligomer type, improving the adhesion properties of the monomer type and preventing oxidation. In addition, by including the additive added to the optical resin in an amount of less than 5 wt % or 3 wt % or less of the photoinitiator and the light stabilizer relative to the weight of the oligomer and the monomer, the radical reaction may be effectively performed and the decomposition and discoloration of the resin can be suppressed. have. In addition, the optical resin may have increased stability to thermal energy by removing the acrylate having a hydroxyl group and using the acrylate having an epoxy group. This may provide a module having a colored light emitting device, for example, a blue, white, or amber device that generates relatively much heat when the optical resin is used.

<Substrate 401>

Referring to FIGS. 1 to 4, the substrate 401 may include a printed circuit board (PCB). The substrate 410 may include, for example, at least one of a resin-based printed circuit board (PCB), a PCB having a metal core, a flexible PCB, a ceramic PCB, or an FR-4 substrate. When the substrate 401 is disposed as a metal core PCB having a metal layer disposed on the bottom, the heat dissipation efficiency of the light emitting device 100 may be improved. The substrate 401 may be electrically connected to the light emitting device 100. The substrate 401 includes a wiring layer (not shown) thereon, and the wiring layer may be electrically connected to the light emitting device 100. When a plurality of the light emitting devices 100 are arranged on the substrate 401, the plurality of light emitting devices 100 may be connected in series, parallel, or series-parallel by the wiring layer. The substrate 401 may function as a base member or a support member disposed under the light emitting device 100 and the resin layer 420. The upper surface of the substrate 401 may have an X-Y plane. The upper surface of the substrate 401 may be flat or have a curved surface. The thickness of the substrate 401 may be a vertical direction or a height in the Z direction. Here, in the X-Y plane, the X direction may be a first direction, and the Y direction may be a second direction. The Z direction may be a direction orthogonal to the first and second directions. A length of the substrate 401 in the first direction may be greater than a width in the second direction. The length of the substrate 401 in the first direction may be two times or more, for example, four times or more than the width Y1 in the second direction. The plurality of light emitting devices 100 may be arranged on the substrate 401 at a predetermined interval in the first direction. The substrate 401 may be provided in a straight or curved bar shape in a lengthwise direction. The substrate 401 may include a light-transmitting material through which light is transmitted through the upper and lower surfaces. The light-transmitting material may include at least one of polyethylene terephthalate (PET), polystyrene (PS), and polyimide (PI).

The substrate 401 may include, for example, a reflective member 410. The reflective member 410 may be an insulating layer for protecting a circuit pattern having a pad disposed on the substrate 401 or a layer of a reflective material.

<Light Emitting Device (100)>

Figure 7:
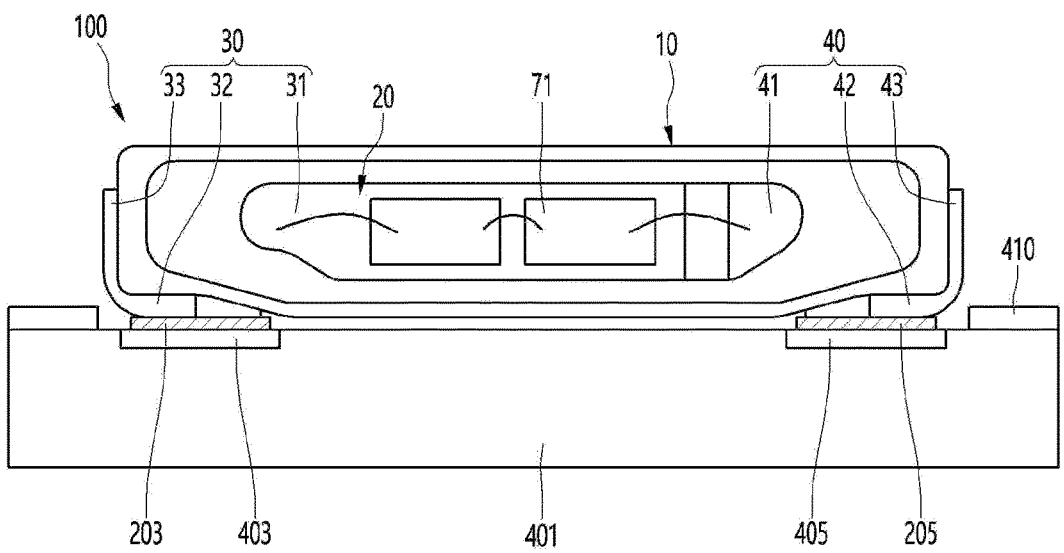
FIG. 7 is an example of a front view of a light emitting device disposed on a substrate of a lighting device according to an embodiment of the invention.
Figure 8:
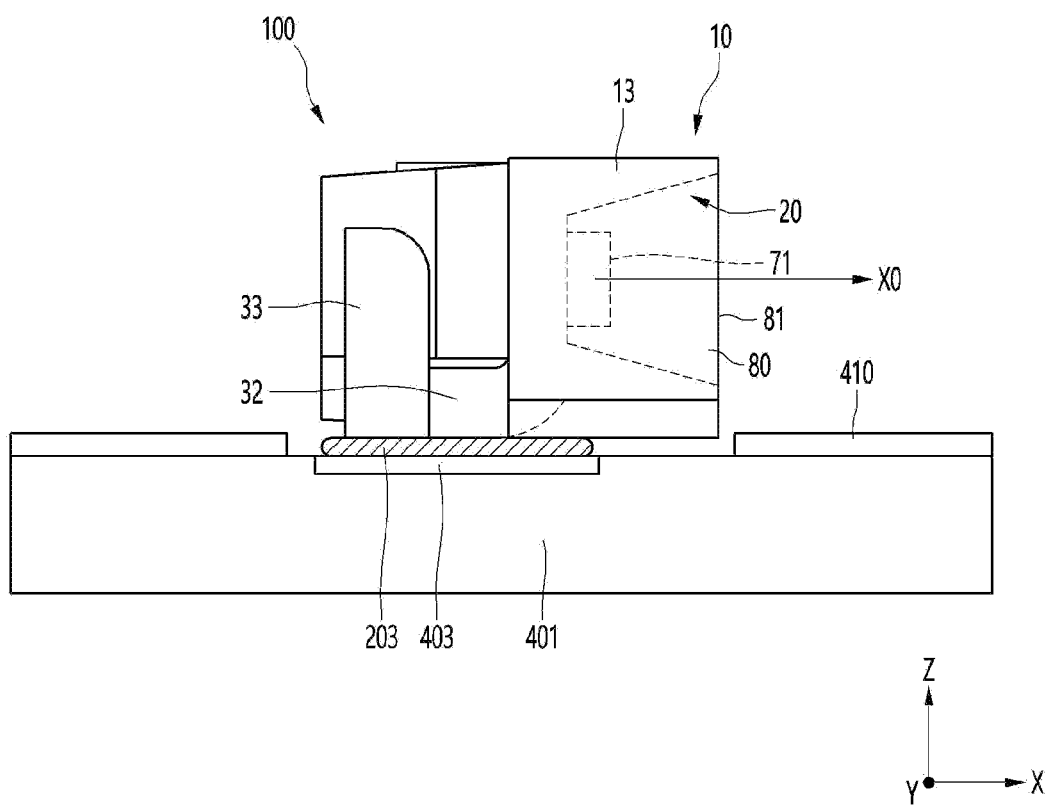
FIG. 8 is a view viewed from the side of the light emitting device of FIG. 7.

Referring to FIGS. 1 to 4, the light emitting device 100 is disposed on the substrate 401 and emits light in a first direction. The light emitting device 100 emits light having the highest intensity in the first direction. The light emitting device 100 may have an emission surface 81 from which light is emitted, and the emission surface 81 is disposed, for example, in a third direction or a vertical direction with respect to a horizontal upper surface of the substrate 401. The emission surface 81 may be a vertical plane, or may include a concave surface or a convex surface. As shown in FIGS. 7 and 8, the light emitting device 100 may be disposed on, for example, the substrate 401 and electrically connected to the pads 403 and 405 of the substrate 401 by conductive bonding members 203 and 205. The conductive bonding members 203 and 205 may be made of a solder material or a metal material.

As another example, the light emitting devices 100 may be arranged on the substrate 401 in at least one row in the second direction, or may be arranged in two or more rows, and the light emitting devices 100 in one or more rows or more may be disposed in the first direction of the substrate 401 or may be disposed in different directions. The light emitting device 100 may be arranged in an M×N matrix, and the M and N may be integers of 2 or more. As another example, the light emitting device 100 may be disposed as a first light emitting device from one end of the substrate 401 and a second light emitting device in an emission direction of the first light emitting device. The first light emitting device and the second light emitting device emit light in the direction of the other end or the first direction of the substrate 401. That is, the first light emitting device irradiates light in the direction of the second light emitting device, and the second light emitting device irradiates light in the direction opposite to the other end of the substrate 401 or the direction on which the first light emitting device is disposed.

The light emitting device 100 may include a device having a light emitting chip 71 in a body or a package in which the light emitting chip 71 is packaged. The light emitting chip 71 may be molded by the molding member 80. The emission surface 81 may be a surface of the molding member 80. The molding member 80 may be made of a transparent resin material such as silicone or epoxy. The light emitting chip 71 may emit at least one of blue, red, green, ultraviolet (UV) and infrared light, and the light emitting device 100 may emit at least one of white, blue, red, green, and infrared light. The light emitting device 100 may be of a side view type in which a bottom portion is electrically connected to the substrate 401, but is not limited thereto. As another example, the light emitting device 100 may be an LED chip or a top-view package. The emission surface 81 of the light emitting device 100 may be disposed on at least one side of the light emitting device 100 rather than the upper surface. The emission surface 81 may be a side adjacent to the substrate 401 among the side surfaces of the light emitting device 100 or a side perpendicular to the upper surface of the substrate 401. The emission surface 81 is disposed on a side surface between the bottom surface and the upper surface of the light emitting device 100, and emits light of the highest intensity in the first direction. The emission surface 81 of the light emitting device 100 may be a surface adjacent to the reflective member 410 or a surface perpendicular to the upper surface of the substrate 401 or the upper surface of the reflective member 410.

Some light emitted through the emission surface 81 of the light emitting device 100 travels in a direction parallel to the top surface of the substrate 401, is reflected by the reflective member 410, or may proceed in the direction of the upper surface of the resin layer 420. The thickness of the light emitting device 100 may be, for example, 3 mm or less, for example, in the range of 0.8 mm to 2 mm. A length (D1 of FIG. 2) in the second direction of the light emitting device 100 may be 1.5 times or more of a thickness of the light emitting device 100. In the light emitting device 100, the distribution of the light emitted in the X direction may have a wider light directivity angle in the ±Y direction than the light directivity angle in the ±Z direction. The light directivity angle of the light emitting device 100 in the second direction may be 110 degrees or more, for example, 120 degrees to 160 degrees or 140 degrees or more. The light directivity angle of the light emitting device 100 in the third direction may be 110 degrees or more, for example, in a range of 120 degrees to 140 degrees.

<Reflective Member 410>

Referring to FIGS. 1 to 4, the reflective member 410 may be a layer separately disposed on the substrate 401 or a layer protecting the upper portion of the substrate 401. The reflective member 410 may be disposed between, for example, the substrate 401 and the resin layer 420. The reflective member 410 may be provided in the form of a film having a metal material or a non-metal material. The reflective member 410 may be adhered to the upper surface of the substrate 401. The reflective member 410 may have an area smaller than an area of a upper surface of the substrate 401. The reflective member 410 may be spaced apart from the edge of the substrate 401, and a resin layer 420 may be attached to the substrate 401 in the spaced apart region. In this case, it is possible to prevent the edge portion of the reflective member 410 from peeling off. The reflective member 410 may include an opening 417 in which a lower portion of the light emitting device 100 is disposed. In the opening 417 of the reflective member 410, the upper surface of the substrate 401 may be exposed and a portion to which the lower portion of the light emitting device 100 is bonded may be disposed. The size of the opening 417 may be the same as or larger than the size of the light emitting device 100, but is not limited thereto. The reflective member 410 may contact the upper surface of the substrate 401 or may be adhered between the resin layer 420 and the substrate 401, but is not limited thereto. Here, the reflective member 410 may be removed when a highly reflective material is coated on the upper surface of the substrate 401. The reflective member 410 may be formed to have a thickness smaller than that of the light emitting device 100. The thickness of the reflective member 410 may include a range of 0.2 mm±0.02 mm. A lower portion of the light emitting device 100 may penetrate through the opening 417 of the reflective member 410 and an upper portion of the light emitting device 100 may protrude. The emission surface 81 of the light emitting device 100 may be provided in a direction perpendicular to the upper surface of the reflective member 410.

The reflective member 410 may include a metallic material or a non-metallic material. The metallic material may include a metal such as aluminum, silver, or gold. The non-metallic material may include a plastic material or a resin material. The plastic material may be any one selected from the group consisting of polyethylene, polypropylene, polystyrene, polyvinyl chloride, polybiphenyl chloride, polyethylene terephthalate, polyvinyl alcohol, polycarbonate, polybutylene terephthalate, polyethylene naphthalate, polyamide, polyacetal, polyphenylene, polyamideimide, polyetherimide, polyetheretherketone, polyimide, polytetrafluoroethylene, liquid crystal polymer, fluororesin, copolymers thereof, and mixtures thereof. As the resin material, a reflective material, for example, a metal oxide such as TiO2, Al2O3, or SiO2 may be added in silicon or epoxy. The reflective member 410 may be implemented as a single layer or a multilayer, and light reflection efficiency may be improved by such a layer structure. The reflective member 410 according to an embodiment of the invention reflects incident light, thereby increasing the amount of light so that the light is emitted with a uniform distribution.

Referring to FIG. 5, the reflective member 410 may include an adhesive layer L1, a reflective layer L2, and a dot layer L3. The adhesive layer L1 may attach the reflective member 410 to the upper surface of the substrate 401. The adhesive layer L1 is a transparent material, and may be an adhesive such as UV adhesive, silicone, or epoxy. The reflective layer L2 may include a plurality of reflective agents La in a resin material. The reflective agents La may be a bubble such as air or a medium having the same refractive index as air. A resin material of the reflective layer L2 may be a material such as silicone or epoxy, and the reflective agents La may be formed by injecting air bubbles into the resin material. The reflective layer L2 may reflect the light incident by the plurality of reflective agents La or refract it in a different direction. The thickness of the reflective layer L2 may be 80% or more of the thickness of the reflective member 410. The dot layer L3 in which a plurality of dots is arranged may be included on the reflective layer L2. The dot layer L3 may be formed on the reflective layer L2 by printing. The dot layer L3 may include a reflective ink. The dot layer L3 may be printed with a material including any one of TiO2, CaCO3, BaSO4, Al2O3, Silicon, or PS. Each dot of the dot layer L3 may have a hemispherical or a polygonal shape in a side cross-section. The density of the dot pattern of the dot layer L3 may be increased as the distance from the emission surface 81 of the light emitting device 100 increases. The material of the dot layer L3 may be white. Since the dot layer L3 is disposed on the upper surface of the reflective layer L2 in the emission direction of the light emitting device 100, it is possible to improve light reflectance, reduce light loss, and improve the luminance of the surface light source.

As another example of the lighting device, the reflective member 410 may be removed from the substrate 401. For example, as shown in FIG. 6, the resin layer 420 may be disposed on the substrate 401 without a reflective member, and the resin layer 420 may be in contact with the upper surface of the substrate 401. In the absence of a reflective member, a metal oxidation problem may occur when the pads 403 and 405 are exposed on the substrate 401, and the resin layer 420 may suppresses metal oxidation in which the metal material is combined with oxygen. That is, the resin layer 420 may suppress metal oxidation caused by moisture by removing the acrylate having a hydroxyl group.

<Resin Layer 420>

The resin layer 420 may be disposed on the substrate 401. The resin layer 420 may face or adhere to the substrate 401. The resin layer 420 may be disposed on all or a portion of the upper surface of the substrate 401. The area of the lower surface of the resin layer 420 may be the same as or smaller than the area of the upper surface of the substrate 401. The resin layer 420 may be formed of a transparent material and may guide or diffuse light. The resin layer 420 includes a UV-curable resin material, and may be used instead of a light guide plate, and it is convenient to adjust the refractive index and adjust the thickness. In addition, the resin layer 420 uses the oligomer disclosed above as a main material, and mixes IBOA, a dilution monomer, and GMA, so that hardness, heat resistance, transmittance may be adjusted, and adhesion and oxidation prevention may be suppressed. The resin layer 420 may contain a photoinitiator and a light stabilizer to control curing and suppress discoloration. Since the resin layer 420 is provided as a layer for guiding light as a resin, it may be provided with a thinner thickness than that of glass and may be provided as a flexible plate. The resin layer 420 may emit the point light source emitted from the light emitting device 100 in the form of a line light source or a surface light source. A bead (not shown) may be included in the resin layer 420, and the bead may diffuse and reflect incident light to increase the amount of light. The beads may be disposed in an amount of 0.01 to 0.3% based on the weight of the resin layer 420. The bead may be composed of any one selected from silicon, silica, glass bubble, polymethyl methacrylate (PMMA), urethane, Zn, Zr, Al2O3, and acryl, and the particle diameter of the beads may be in the range of about 1 μm to about 20 μm, but is not limited thereto. Since the resin layer 420 is disposed on the light emitting device 100, it is possible to protect the light emitting device 100 and reduce loss of light emitted from the light emitting device 100. The light emitting device 100 may be buried under the resin layer 420.

The resin layer 420 may be in contact with the surface of the light emitting device 100 and may be in contact with the emission surface 81 of the light emitting device 100. A portion of the resin layer 420 may be disposed in the opening 417 of the reflective member 410. A portion of the resin layer 420 may be in contact with the upper surface of the substrate 401 through the opening 417 of the reflective member 410. Accordingly, a portion of the resin layer 420 may be in contact with the substrate 401, thereby fixing the reflective member 410 between the resin layer 420 and the substrate 401.

Referring to FIG. 4, the thickness Z1 of the resin layer 420 may be 1.8 mm or more, for example, in a range of 1.8 to 2.5 mm. When the thickness Z1 of the resin layer 420 is thicker than the above range, the luminous intensity may be lowered, and it may be difficult to provide a flexible module due to an increase in the module thickness. When the thickness Z1 of the resin layer 420 is smaller than the above range, it is difficult to provide a surface light source having a uniform luminous intensity. The length of the resin layer 420 in the first direction X may be the same as the length of the substrate 401 in the first direction, and the width of the resin layer 420 in the second direction Y may be the same the width Y1 of the substrate 401 in the second direction. Accordingly, each side surface of the resin layer 420 may be disposed on the same plane as each side surface of the substrate 401. For example, the first and second side surfaces S1 and S2 of the substrate 401 may be disposed on the same vertical surface as both sides of the resin layer 420. The resin layer 420 may be provided in a size to cover the plurality of light emitting devices 100 or may be connected to each other. The resin layer 420 may be divided into a size to cover each light emitting device 100, and may be divided into light emitting cells having each light emitting device 100/each resin layer 420. The upper surface of the resin layer 420 may have a first adhesive force. The upper surface of the resin layer 420 may have a first adhesive force and may be adhered to the light transmitting layer 415.

<Light Transmitting Layer 415>

The light transmitting layer 415 may be an adhesive material such as silicone or epoxy, or may include a diffusion material. The diffusion material may include at least one of polyester (PET), poly methyl methacrylate (PMMA), or polycarbonate (PC). The light transmitting layer 415 may include an adhesive region that is adhered to the upper surface of the resin layer 420 and a non-adhesive region that is not adhered or spaced apart from the upper surface of the resin layer 420. The light transmitting layer 415 is disposed on 60% or more, for example, 80% or more, of the upper surface area of the resin layer 420, so that the diffusion layer 430 may be in close contact with the resin layer 420 or the lower diffusion layer (not shown).

<Light Blocking Portion 425>

The light blocking portion 425 may face the upper surface of the resin layer 420. The light blocking portion 425 may overlap the light emitting device 100 in a vertical direction or a third direction Z. Each of the plurality of light blocking portions 425 may be vertically overlapped with each of the plurality of light emitting devices 100. The light blocking portion 425 may be disposed between the resin layer 420 and the diffusion layer 430. When the diffusion layer 430 is disposed in plurality, the light blocking portion 425 may be disposed between the plurality of diffusion layers. The light blocking portion 425 may be disposed in the light transmitting layer 415. The light blocking portion 425 may pass through the light transmitting layer 415 and may be in contact with at least one of the resin layer 425 and the diffusion layer 430. The light blocking portion 425 may include a gap portion 427 spaced apart from the inner surface of the light transmitting layer 415 and/or the upper surface of the resin layer 420. The gap portion 427 may provide a refractive index different from that of the light blocking portion 425, thereby improving light diffusion efficiency. The lower surface S13 of the light blocking portion 425 may be spaced apart from or out of contact with the upper surface of the lower layer, for example, the upper surface of the resin layer 420. The gap portion 427 may be an air region or a vacuum region. The interval B1 between the light blocking portions 425 may be smaller than the interval X1 between the light emitting devices 100. The light blocking portion 425 may be spaced apart from the outer surface of the resin layer 420. A plurality of the light blocking portions 425 may be arranged in the first direction.

The plurality of light blocking portions 425 may have the same shape as each other. The light blocking portion 425 may be disposed on each light emitting device 100. Each of the light blocking units 425 may be disposed in a direction perpendicular to each of the light emitting devices 100 and in a peripheral region thereof.

The light blocking portion 425 may be disposed higher than the upper surface of the resin layer 420. The light blocking portion 425 may be 50% or more of the upper surface area of the light emitting device 100 on the light emitting device 100, or may be in the range of 50% to 200%. The light blocking portion 425 may be a region printed with a white material. The light blocking portion 425 may be printed using, for example, a reflective ink including any one of TiO2, Al2O3 CaCO3, BaSO4, and Silicon. The light blocking portion 425 reflects the light emitted through the emission surface of the light emitting device 100, thereby reducing the occurrence of hot spots on the light emitting device 100. The light blocking portion 425 may print a light blocking pattern using light blocking ink. The light blocking portion 425 may be formed by printing on the lower surface of the diffusion layer 430. The light blocking portion 425 is a material that does not block 100% of incident light, may have transmittance lower than reflectance, and may perform a function of blocking and diffusing light. The light blocking portion 425 may be formed in a single layer or multiple layers, and may have the same pattern shape or different pattern shapes. The light blocking portion 425 may have the same thickness. The thickness of the light blocking portion 425 may be formed to have a different thickness according to a region. As for the thickness of the light blocking portion 425, the center region may be the thickest and the edge region may be thinner than the center region. The thickness of the light blocking portion 425 may be proportional to the incident light intensity.

The size of the light blocking portion 425 may be arranged in a range of 50% or more, for example, 50% to 200%, of the upper surface area of the light emitting device 100 to block incident light. Accordingly, it is possible to reduce the problem of the light emitting device 100 being visible from the outside, and to reduce hot spots on the region of the light emitting device 100, thereby providing a uniform light distribution over the entire region. As another example, the light blocking portion 425 may be an air region in a recess formed by an etching process on the upper surface of the resin layer 420, or may include a light blocking layer in which the light blocking material is disposed. The etching region may cover the emission surface of the light emitting device 100 by disposing the light emitting device 100 in a range of 50% to 200% of the upper surface area thereof, like the region of the light blocking portion. The light blocking portion 425 may be disposed in a hemispherical, elliptical, or circular shape with respect to the light emitting device 100.

Referring to FIGS. 2 and 4, the width C1 in the second direction Y of the region adjacent to the light emitting device 100 in the light blocking portion 425 is small and gradually increases toward the center of the light blocking portion 425, and the width (e.g., C3) in the second direction Y from the center may be maximally increased. The width in the second direction Y may gradually decrease as it moves away from the light emitting device 100 from the center of the light blocking portion 425. The maximum width C3 in the second direction Y at the center of the light blocking portion 425 is the largest, and the width in the second direction Y may be gradually narrowed as it moves away from the center of the light blocking portion 425 in the first direction X. In the light blocking portion 425, a region overlapping the light emitting device 100 in the vertical direction has a flat outer surface, and the flat outer surface has a width C1 in the second direction Y greater than the length D1 of the light emitting device 100 in the second direction. The second direction width C1 of the light blocking portion 425 is disposed to be 0.8 mm or more larger than the length D1 of the light emitting device 100, so that the light blocking portion 425 may be covered both sides of the light emitting device 100 and may prevent a hot spot caused by the light emitted from the light emitting device 100. A maximum length B3 of the light blocking portion 425 in the first direction X may be equal to or smaller than a maximum width C3 of the second direction Y. The maximum width C3 may be 13 mm or more, for example, in the range of 13 mm to 17 mm. The maximum width C3 of the light blocking portion 425 in the second direction Y may vary according to the length D1 of the light emitting device 100 in the second direction Y. The maximum width C3 of the light blocking portion 425 in the second direction Y may be 50% or more of the length Y1 of the substrate 401 in the second direction Y, for example, in the range of 50% to 90%. Here, the distance X1 between the light emitting devices 100 may be 25 mm or more, for example, in the range of 25 mm to 30 mm, and may vary depending on the characteristics of the light emitting devices 100. The light blocking portion 425 provides the maximum length B3 in the first direction X passing through the center of the light blocking portion 425 and the maximum width C3 in the second direction Y in the above range, it is possible to reduce hot spots on the light emitting device 100 and to improve light uniformity.

As shown in FIG. 4, the thickness Z3 of the light blocking portion 425 may be 0.1 times or less, for example, in a range of 0.05 times to 0.1 times the thickness Z1 of the resin layer 420. The thickness Z3 of the light blocking portion 425 may be 100 μm or more, for example, in the range of 100 to 200 μm. When the thickness Z3 of the light blocking portion 425 is smaller than the above range, there is a limit to reducing hot spots, and when the thickness Z3 is larger than the above range, light uniformity may be deteriorated. The distance Z4 between the upper surface of the light emitting device 100 and the lower surface of the light blocking portion 425 may be 0.4 mm or more, for example, in the range of 0.4 mm to 0.6 mm. The distance Z0 between the upper surface of the light emitting device 100 and the upper surface of the reflective member 410 may be 0.8 mm or more, for example, 0.8 mm to 1.4 mm. The region of the light blocking portion 425 may not vertically overlap with the region of the light transmitting layer 415. The light blocking portion 425 may be provided on each of the light emitting devices 100 with a size or area sufficient to prevent a hot spot caused by the light emitted in the emission direction of the light emitting device 100. In addition, the light blocking portion 425 allows the light emitting device 100 to emit light in the side direction, that is, in the first direction, so that it covers a region capable of increasing the light blocking efficiency due to the light directed distribution of the light emitting device 100 and the reflection characteristics.

<Diffusion Layer 430>

The diffusion layer 430 may be disposed on the resin layer 420. A lower surface of the diffusion layer 430 may include a first region S11 in which the light transmitting layer 415 is disposed and a second region S12 in which the light block-ing portion 425 is disposed. The diffusion layer 430 may have the light blocking portion 425 printed thereon, and may be fixed on the resin layer 420 through the light transmitting layer 415. Here, when a lower diffusion layer (not shown) is disposed between the light transmitting layer 415 and the resin layer 420, the lower diffusion layer may adhere to the resin layer 420, for example, the upper surface of the resin layer 420 may be adhered to the lower diffusion layer by a first adhesive force having a micro ciliary. In this case, the diffusion layer 430 and/or the lower diffusion layer may be attached to the resin layer 420 by applying a predetermined pressure or pressure/heat.

The diffusion layer 430 may include at least one of a polyester (PET) film, a poly methyl methacrylate (PMMA) material, or a polycarbonate (PC) material. The diffusion layer 430 may be provided as a film made of a resin material such as silicone or epoxy. The diffusion layer 430 may include a single layer or multiple layers. The thickness Z2 of the diffusion layer 430 is 25 micrometers or more, and may be, for example, in the range of 25 to 250 micrometers or in the range of 100 to 250 micrometers. The diffusion layer 430 may provide incident light having the above thickness range as a uniform surface light source. The diffusion layer 430 and/or the lower diffusion layer may include at least one or two or more of a diffusion agent such as beads, a phosphor, and ink particles. The phosphor may include, for example, at least one of a red phosphor, an amber phosphor, a yellow phosphor, a green phosphor, and a white phosphor. The ink particles may include at least one of metal ink, UV ink, and curing ink. The size of the ink particles may be smaller than the size of the phosphor. The surface color of the ink particles may be any one of green, red, yellow, and blue. The ink types may be selectively applied among PVC (Poly vinyl chloride) ink, PC (Polycarbonate) ink, ABS (acrylonitrile butadiene styrene copolymer) ink, UV resin ink, epoxy ink, silicone ink, PP (polypropylene) ink, water-based ink, plastic ink, PMMA (poly methyl methacrylate) ink and PS (Polystyrene) ink. The ink particles may include at least one of metal ink, UV ink, and curing ink. In the embodiment of the invention, light diffused by the resin layer 420 may be transmitted through the light transmitting layer 415 and may be emitted as a surface light source through the diffusion layer 430. In this case, the light blocking portion 425 may prevent a hot spot caused by the incident light. In another example of the invention, a reflective layer or an upper substrate may be disposed on the resin layer 420. The layer of the reflective material or the upper substrate may face the upper surface of the resin layer 420, and the light emitting devices 100 are arranged in at least one row or column, and each emission surface 81 of the light emitting devices 100 may be disposed at the same distance as one side of the resin layer 420, and may emit light through one side of the resin layer 420.

The resin layer 420, which is an optical resin according to an embodiment of the invention, has an oligomer content of 20-25%, an IBOA content of 40-50% as a monomer, a dilution monomer content of 10-20%, and a GMA content of 10-15%, the content of the photoinitiator is added in an amount of 0.5-3 wt % based on the weight of the oligomer and the monomer, and the content of the light stabilizer may include 0.5-2 wt % based on the weight of the oligomer and the monomer. Table 3 shows a comparison of the oxidation retardation effect or the ratio of the luminous flux drop in the resin layer 420.

TABLE 3

| | Sample information | | Module having Ag- Flux drop (%) | | | Module having Au- Flux drop (%) | | |
|---|---|---|---|---|---|---|---|---|
| No | Large segment | Small segment | 500 h | 750 h | 1000 h | 500 h | 750 h | 1000 h |
| 0 | Standard | Resin absence | 0.55% | −9.48% | −8.96% | 1.64% | −9.39% | −2.72% |
|  |  | Resin presence | −16.18% | −32.99% | −78.12% | −10.08% | −17.60% | −45.90% |
| 3 | Epoxy | 1% | −0.73% | −23.79% | −28.15% | −0.96% | −21.89% | −26.88% |
| 4 | additives | 2% | −5.38% | −21.46% | −25.50% | 1.09% | −17.45% | −24.77% |
| 5 | Epoxy | M100 3% | −1.24% | −20.70% | −24.72% | 2.07% | −11.09% | −19.38% |
| 6 | Acrylate | M100 5% | 0.82% | −9.29% | −15.70% | 3.71% | −4.10% | −9.53% |
| 7 | additions | GMA 3% | −4.53% | −23.16% | −33.09% | −2.66% | −13.13% | −22.31% |
| 8 |  | GMA 5% | −5.01% | −21.68% | −22.97% | −0.74% | −14.75% | −17.24% |
| 9 |  | GMA 7% | −3.44% | −19.57% | −20.44% | −0.26% | −12.00% | −15.14% |

Here, the module having Ag or Au may be a material of the upper pad of the substrate 401 and/or the electrode of the light emitting device 100. Table 3 shows the measured values of the luminous flux drop when the above-described metal is disposed on the substrate 401 and the light emitting device 100 and sealed by the resin layer, and it may be seen that, as a whole, in the material containing an epoxy group, there is an oxidation retarding effect in the samples 3-9, and the luminous flux drop does not significantly increase in the samples 5-9 to which the epoxy acrylate is added. This is because the epoxy acrylate removes the acrylate having a hydroxy group, thereby suppressing moisture penetration and delaying oxidation by moisture rather than a composition with a simple resin. Such a luminous flux drop may be caused by corrosion of the metal portion of the module due to oxidation for a large amount of time h in a high temperature and high humidity environment. In this case, the light emitting device may include a red LED chip. In chemical Formula 1 below, it is an example of combination of an epoxy group K1 and an acrylate K2.

[Chemical Formula 1]

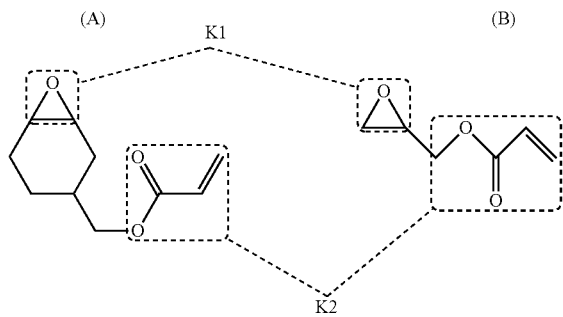

Table 4 compares the luminous flux drop after the lighting test of the white light emitting device and the red light emitting device in a high temperature and high humidity environment. Here, the red LED may be a light emitting device having a red LED chip, and the white LED may be a light emitting device having a blue LED chip and a phosphor.

TABLE 4

| | | Flux drop (%) | | | |
|---|---|---|---|---|---|
| LED | Resin | 250 h | 500 h | 750 h | 1000 h |
| Red | Comparative example | −7.12% | −10.08% | −17.60% | −45.90% |
|  | Embodiment example | −0.12% | −0.83% | −1.11% | −2.45% |
| White | Comparative example | −19.03% | −58.98% | — | — |
|  | Embodiment example | −13.50% | −29.57% | −44.07% | −78.11% |

Here, the comparative example is a case in which an acrylate material having a hydroxyl group is used in the resin, and the embodiment example is a case in which an acrylate material having a hydroxyl group is removed from the resin. In this case, it can be seen that when the material having a hydroxyl group is removed from the optical resin or resin layer covering the red light emitting device and the white light emitting device, reliability is improved in terms of luminous flux drop. In addition, by removing the acrylate having a hydroxyl group from the resin, oxidation or discoloration of the substrate may be suppressed in a high-temperature, high-humidity environment, so that the above-described reflective member may be removed. In the embodiment of the invention, when a light emitting device having a blue LED having a higher luminous intensity than a red light emitting device is applied, when a HALS additive is not used, a problem of discoloration may occur at the interface between the resin layer and the light emitting device. That is, discoloration may occur at the interface portion AO (refer to FIG. 4) between the molding member 80 and the resin layer 420 of the light emitting device, respectively, and thus optical reliability may be deteriorated. That is, since the UV resin is weak to light intensity, it is possible to suppress discoloration in the interface portion AO by including a UV stabilizer, that is, a light stabilizer. Table 5 shows a comparison of the luminous flux drop when a UV stabilizer and a UV absorber are added to the optical resin surrounding the white light emitting device in the embodiment.

TABLE 5

| Additive | | Flux drop (%) | | |
|---|---|---|---|---|
| Series | Product name | 500 h | 750 h | 1000 h |
| No additive (reference) | No additive (reference) | −60% | — | — |
| UV Stabilizer (HALS) | Tinuvin292 | 0% | 0% | 0% |
| UV Stabilizer (HALS) | Tinuvin123 | −4% | −4% | −5% |
| UV Stabilizer (HALS) | Tinuvin 770DF | −3% | −2% | −2% |
| UV absorber | Tinuvin384-2 | −10% | −20% | −59% |
| UV absorber | Tinuvin 477 | −18% | −30% | −72% |
| Stabilizer Adsorber | Tinuvin292 + 477 + 384-2 | −28% | −40% | — |

As shown in Table 5, when the UV stabilizer is used as an additive in the optical resin surrounding the light emitting device, it can be seen that the luminous flux drop appears lower than when the UV absorber is added. The UV stabilizer may include a HALS-based stabilizer.

This HLAS-based mechanism may be stabilized as shown in Chemical Formula 2.

[Chemical Formula 2]

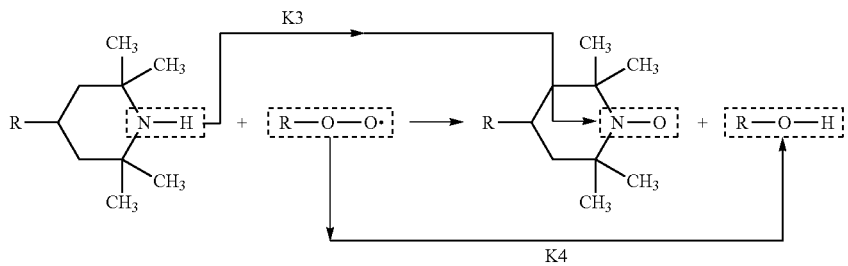

Here, step K3 shows an example in which N—H (amine) reacts with radicals to stabilize the organic material state, and in step K4, when the organic material receives light or heat, peroxide is formed into an alkyl group radical structure, but radicals may be removed and stabilized by HALS-based additives. In the case of using a UV stabilizer without an absorber in an optical resin, discoloration of the resin may be suppressed and the luminous flux drop may be lowered. Table 6 shows the results measured with a UV-visible measuring device with a thickness of 2.0 mm of the optical resin.

TABLE 6

| Condition | Resin | Time (h) | L | a | b | ΔE | Transmittance (%) (380-780 nm average) |
|---|---|---|---|---|---|---|---|
| High temperature-115° C. | Comparative example | 0 | 97 | −0.06 | 0.3 | | 92.30 |
| | | 1000 | 96.43 | −0.2 | 5.45 | 5.19 | 83.12 |
| | Embodiment example | 0 | 96.46 | −0.32 | 0.55 | | 90.33 |
| | | 1000 | 96.25 | −0.4 | 1.48 | 0.96 | 83.46 |
| High temperature/ High humidity-85° C./85% | Comparative example | 0 | 97.00 | −0.06 | 0.3 | | 92.30 |
| | | 1000 | 96.43 | −0.2 | 1.12 | 1.01 | 90.46 |
| | Embodiment example | 0 | 96.51 | −0.27 | 0.91 | | 90.31 |
| | | 1000 | 96.42 | −0.27 | 1.00 | 0.13 | 90.20 |

A comparative example is a resin including an acrylate (2-EHA) having a hydroxyl group without a GMA monomer and a HALS-based stabilizer, and an embodiment example is the optical resin disclosed above. In Table 6, L represents the chromaticity of the organic material, a is the chroma (Green-Red scale) value, b is the chroma (Yellow-Blue scale) value, and may be an index indicating the degree of discoloration. At this time, ΔE represents the degree of discoloration as a numerical value, and when it is 1.0 or more, a color change may be recognized with the naked eye, and when it is 20 or more, a change in color coordinates may occur. In the embodiment, it may be seen that the numerical value indicating the degree of discoloration is less than 1, and there is little decrease in transmittance. FIG. 7 is a front view showing a light emitting device on a substrate in a lighting module according to an embodiment, and FIG. 8 is a side view of the light emitting device of FIG. 7.

Referring to FIGS. 7 and 8, the light emitting device 100 includes a body 10 having a cavity 20, a plurality of lead frames 30 and 40 in the cavity 20, and a light emitting chip 71 disposed on at least one of the plurality of lead frames 30 and 40. The light emitting device 100 may be implemented as a side emission type package.

The body 10 may include a cavity 20 in which the lead frames 30 and 40 are exposed at the bottom. The plurality of lead frames 30 and 40 are separated into, for example, a first lead frame 30 and a second lead frame 40 and coupled to the body 10. The body 10 may be formed of an insulating material. The body 10 may be formed of a reflective material. The body 10 may be formed of a material having a reflectance higher than a transmittance for a wavelength emitted from the light emitting chip, for example, a material having a reflectance of 70% or more. When the reflectivity is 70% or more, the body 10 may be defined as a non-transmissive material or a reflective material. The body 10 may be formed of a resin-based insulating material, for example, a resin material such as Polyphthalamide (PPA). The body 10 may be formed of a silicone-based, epoxy-based, or thermosetting resin including a plastic material, or a high heat and light resistance material. The body 10 includes a white-based resin. In the body 10, an acid anhydride, an antioxidant, a mold release material, a light reflector, an inorganic filler, a curing catalyst, a light stabilizer, a lubricant, and titanium dioxide may be selectively added. The body 10 may be molded by at least one selected from the group consisting of an epoxy resin, a modified epoxy resin, a silicone resin, a modified silicone resin, an acrylic resin, and a urethane resin. The body 10 may include a reflective material, for example, a resin material to which a metal oxide is added, and the metal oxide may include at least one of TiO2, SiO2, and Al2O3. The body 10 may effectively reflect incident light. As another example, the body 10 may be formed of a translucent resin material or a resin material having a phosphor for converting the wavelength of incident light. The bottom of the body 10 may be a side surface corresponding to the substrate 401.

The first lead frame 30 includes a first lead part 31 disposed on the bottom of the cavity 20, a first bonding part 32 extending outside the body 10, and a first heat dissipation part 33. The first bonding part 32 is bent from the first lead part 31 in the body 10 and protrudes outside the body, and the first heat dissipation part 33 may be bent from the first bonding part 32. The second lead frame 40 includes a second lead part 41 disposed on the bottom of the cavity 20, a second bonding part 42 and a second heat dissipation part 43 disposed on an outer region of the body 10. The second bonding part 42 may be bent from the second lead part 41 in the body 10, and the second heat dissipation part 43 may be bent from the second bonding part 42. Here, the light emitting chip 71 may be disposed on the first lead part 31 of the first lead frame 30, for example, and connected to the first and second lead parts 31 and 41 with a wire, or may be connected to the first lead part 31 with an adhesive and connected to the second lead part 41 with a wire. The light emitting chip 71 may be a horizontal chip, a vertical chip, or a chip having a via structure. The light emitting chip 71 may be mounted in a flip chip method. The light emitting chip 71 may selectively emit light within a wavelength range of ultraviolet to visible light. The light emitting chip 71 may emit, for example, ultraviolet or blue peak wavelength. The light emitting chip 71 may include at least one of a group II-VI compound and a group III-V compound. The light emitting chip 71 may be formed of, for example, a compound selected from the group consisting of GaN, AlGaN, InGaN, AlInGaN, GaP, AlN, GaAs, AlGaAs, InP, and mixtures thereof. One or a plurality of the light emitting chips 71 may be disposed in the cavity 20 and emit light with the greatest intensity in the direction of the central axis X0. One or a plurality of light emitting chips disposed in the cavity 20 of the light emitting device 100 according to the embodiment may be disposed. The light emitting chip may be selected from, for example, a red LED chip, a blue LED chip, a green LED chip, and a yellow green LED chip.

A molding member 80 is disposed in the cavity 20 of the body 11, and the molding member 80 includes a light-transmitting resin such as silicone or epoxy, and may be formed in a single layer or in multiple layers. A phosphor for changing the wavelength of the emitted light may be included on the molding member 80 or the light emitting chip 71, and the phosphor excites a portion of the light emitted from the light emitting chip 71 to generate a different wavelength. emitted as light. The phosphor may be selectively formed from quantum dots, YAG, TAG, silicate, nitride, and oxygen-nitride-based materials. The phosphor may include at least one of a red phosphor, a yellow phosphor, and a green phosphor, but is not limited thereto. The emission surface 81 of the molding member 80 may be formed in a flat shape, a concave shape, a convex shape, or the like, but is not limited thereto. As another example, a light-transmitting film having a phosphor may be disposed on the cavity 20, but the present disclosure is not limited thereto. A lens may be further formed on the upper portion of the body 10, and the lens may include a structure of a concave and/or convex lens, and control the light distribution of the light emitted by the light emitting device 100. A semiconductor device such as a light receiving device and a protection device may be mounted on the body 10 or any one of the lead frames, and the protection device may be implemented as a thyristor, a Zener diode, or a TVS (Transient voltage suppression), The Zener diode protects the light emitting chip from electrostatic discharge (ESD). At least one or a plurality of light emitting devices 100 are disposed on the substrate 401, and a reflective member 410 is disposed around a lower portion of the light emitting device 100. The first and second lead portions 33 and 43 of the light emitting device 100 are bonded to the pads 403 and 405 of the substrate 401 with solder or conductive tape as conductive adhesive members 203 and 205.

Figure 9:
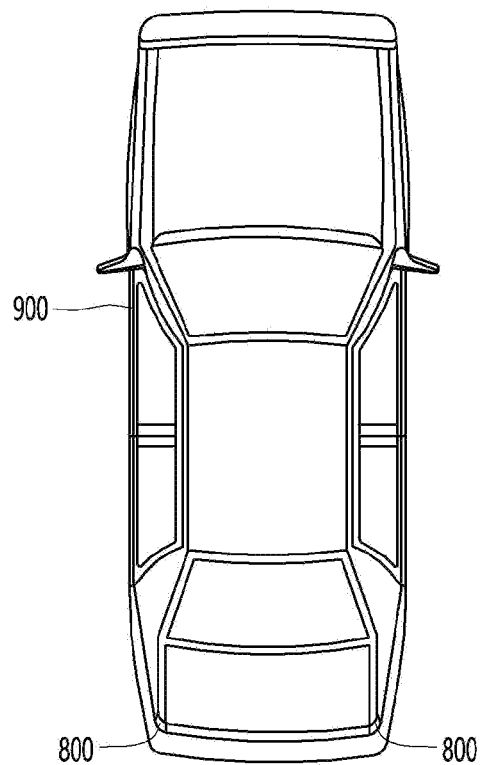
FIG. 9 is a view showing a lamp having a lighting module or a lighting device according to an embodiment.
Figure 10:
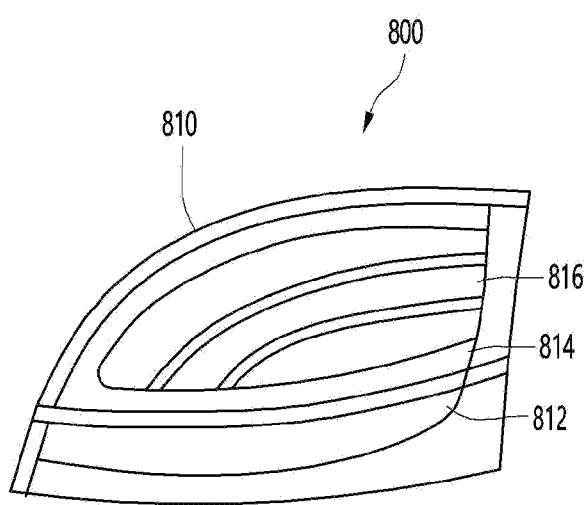
FIG. 10 is a plan view of a vehicle to which the vehicle lamp of FIG. 9 is applied.

FIG. 9 is a view showing a vehicle lamp having a lighting module or a lighting device according to an embodiment, and FIG. 10 is a plan view of a vehicle to which the vehicle lamp of FIG. 9 is applied.

Referring to FIGS. 9 and 10, the tail light 800 in the vehicle 900 may include a first lamp unit 812, a second lamp unit 814, a third lamp unit 816, and a housing 810. Here, the first lamp unit 812 may be a light source serving as a turn indicator, the second lamp unit 814 may be a light source serving as a sidelight, and the third lamp unit 816 may be a light source serving as a brake light, but is not limited thereto.

The housing 810 accommodates the first to third lamp units 812, 814, and 816, and may be made of a light-transmitting material. In this case, the housing 810 may have a curve according to the design of the vehicle body, and the first to third lamp units 812, 814, and 816 implement a surface light source that may have a curved surface according to the shape of the housing 810. As shown in FIG. 28, when the lamp unit is applied to a tail light, a brake light, or a turn signal lamp of a vehicle, it may be applied to a turn signal lamp of a vehicle.

Features, structures, effects, etc. described in the above embodiments are included in at least one embodiment of the invention, and are not necessarily limited to only one embodiment. Furthermore, features, structures, effects, etc. illustrated in each embodiment may be combined or modified for other embodiments by those of ordinary skill in the art to which the embodiments belong. Accordingly, the contents related to such combinations and modifications should be interpreted as being included in the scope of the invention. In addition, although the embodiment has been described above, it is only an example and does not limit the invention, and those of ordinary skill in the art to which the invention pertains are exemplified above in a range that does not depart from the essential characteristics of the present embodiment. It may be seen that various modifications and applications that have not been made are possible. For example, each component specifically shown in the embodiment may be implemented by modification. And the differences related to these modifications and applications should be construed as being included in the scope of the invention defined in the appended claims.

The invention claimed is:
1. An optical resin comprising:
   in the optical resin disposed on a surface of a molding member sealing a light emitting chip or a surface of a light emitting device having a light emitting chip,
   oligomers, monomers and additives;
   wherein the monomer include acrylate having an epoxy group without using acrylate having a hydroxyl group, the monomer includes IBOA (Iso-bornyl Acrylate), two or more dilution monomers, and glycidyl methacrylate (GMA), wherein the additive includes a photoinitiator of ultraviolet wavelength and an amine-based light stabilizer, wherein in the oligomer and the monomer, a content of the oligomer is 20-25%, a content of the IBOA is 40-50%, a content of the two or more dilution monomers is 10-20%, and a content of the glycidyl methacrylate is 10 to 15%, wherein the optical resin is a curable transparent resin, and wherein a content of the monomer in the optical resin is three times higher than the content of the oligomer.

2. The optical resin of claim 1, wherein the two or more dilution monomers include caprolactone acrylate, and lactone methacrylate, wherein the light stabilizer includes a HALS (Hindered-Amine Light Stabilizers)-based UV stabilizer.

3. The optical resin of claim 2, wherein the photoinitiator has a higher content than the light stabilizer, and comprises 0.5 to 3 wt % based on a weight of the oligomer and the monomer.

4. The optical resin of claim 1, wherein the optical resin is directly contacted with the surface of the light emitting device having the light emitting chip and an upper surface of a substrate on which the light emitting device is mounted.

5. A lighting device comprising:
a substrate;
a light emitting device disposed on the substrate;
a resin layer sealing the light emitting device on the substrate; and
a diffusion layer or a reflective substrate disposed on the resin layer,
wherein the resin layer includes an oligomer, a monomer and an additive,
wherein the monomer include acrylate having an epoxy group without using acrylate having a hydroxyl group, and the monomer includes IBOA (Iso-bornyl Acrylate), two or more dilution monomers, and glycidyl methacrylate (GMA),
wherein the additive includes a photoinitiator and an amine-based light stabilizer,
wherein in the oligomer and the monomer, content of the oligomer is 20-25%, content of the IBOA is 40-50%, content of the two or more dilution monomers is 10-20%, and content of the glycidyl methacrylate is 10 to 15%,
wherein the resin layer is a curable transparent resin cured by ultraviolet light,
wherein a content of the monomer in a total content of the optical resin is three times higher than the content of the oligomer.

6. The lighting device of claim 5, wherein the light emitting device includes a light emitting chip therein, and a molding member sealing the light emitting chip, and emitting light in a lateral direction of the resin layer through an emission surface of the molding member,
wherein the emission surface of the molding member is in contact with the resin layer.

7. The lighting device of claim 5, wherein the photoinitiator is an initiator of ultraviolet wavelength,
wherein a content of the photoinitiator in the resin layer is higher than a content of the light stabilizer.

8. The lighting device of claim 5, wherein a content of the photoinitiator is 0.5 to 3 wt % based on a sum of a masses of the oligomer and the monomer in the resin layer, and a content of the light stabilizer is 0.5 to 2 wt %.

9. The lighting device of claim 8, wherein the two or more dilution monomers include caprolactone-based acrylate, and lactone-based methacrylate,
wherein the light stabilizer includes a HALS (Hindered-Amine Light Stabilizers)-based UV stabilizer.

10. The lighting device of claim 9, wherein the oligomer comprises at least two or more of polyester acrylate, epoxy acrylate, polyether acrylate, and silicone acrylate,
wherein the monomer is a material that does not contain an acrylate having the hydroxy group.

11. The lighting device of claim 6,
wherein the molding member has a phosphor,
wherein the resin layer is spaced apart from the phosphor.

12. The lighting device of claim 11,
wherein a thickness of the resin layer is thicker than a thickness of the light emitting device and is in a range of 1.8 mm to 2.5 mm.

13. The lighting device of claim 12, comprising:
a diffusion layer disposed on the resin layer;
a light transmitting layer adhered between the resin layer and the diffusion layer; and
a light blocking portion disposed between the resin layer and the diffusion layer and overlapping the light emitting device in a vertical direction,
wherein an upper surface of the resin layer has macro cilia and is in contact with the light transmitting layer.

14. The lighting device of claim 13,
wherein the light blocking portion is in non-contact with the upper surface of the resin layer.

15. The lighting device of claim 5, wherein a portion of the resin layer is directly contacted with an upper surface of the substrate.

* * * * *